(12) United States Patent
Chang et al.

(10) Patent No.: US 7,180,156 B2
(45) Date of Patent: Feb. 20, 2007

(54) THIN-FILM DEVICES AND METHOD FOR FABRICATING THE SAME ON SAME SUBSTRATE

(75) Inventors: Shih-Chang Chang, Hsinchu (TW); Yaw-Ming Tsai, Hsien (TW)

(73) Assignee: TPO Displays Corp., Chu-Nan (TW)

( * ) Notice: Subject to any disclaimer, the term of this patent is extended or adjusted under 35 U.S.C. 154(b) by 87 days.

(21) Appl. No.: 10/954,674

(22) Filed: Sep. 30, 2004

(65) Prior Publication Data

US 2005/0224793 A1 Oct. 13, 2005

(30) Foreign Application Priority Data

Apr. 13, 2004 (TW) ................. 93110215 A

(51) Int. Cl.
*H01L 29/00* (2006.01)
(52) U.S. Cl. .................. 257/535; 257/74; 257/59; 257/532; 257/E21.703; 257/E27.111; 257/E29.137
(58) Field of Classification Search .................. None
See application file for complete search history.

(56) References Cited

U.S. PATENT DOCUMENTS 6,316,787 B1 * 11/2001 Ohtani .................. 257/59
2004/0126914 A1 * 7/2004 Chang et al. .......... 438/30

* cited by examiner

*Primary Examiner*—Nathan Flynn
*Assistant Examiner*—Scott Wilson
(74) *Attorney, Agent, or Firm*—Liu & Liu

(57) ABSTRACT

To satisfy the different requirement of TFTs function as peripheral driving circuit and pixel switching device, the modified TFT structure with various thicknesses of gate insulating layers is disclosed. For the peripheral driving circuit, the thinner thickness of the gate-insulating layer is formed, the higher driving ability the TFT performs. However, for the pixel switching device, the thicker thickness of the gate insulating layer is formed, the better reliability the TFT has. The present invention provides a first TFT (peripheral driving circuit) comprising a first gate insulating layer and a second TFT (pixel switching device) comprising a first and second gate insulating layer. Thus, the gate insulating layer of the peripheral driving circuit has a thickness less then that of the pixel switching device.

15 Claims, 6 Drawing Sheets

THIN-FILM DEVICES AND METHOD FOR FABRICATING THE SAME ON SAME SUBSTRATE

BACKGROUND OF THE INVENTION

1. Field of the Invention

The present invention relates to a thin-film device technology, and more particularly to a thin-film device technology simultaneously providing thin-film devices on a same substrate.

2. Description of the Related Art

In an active matrix liquid crystal display (AMLCD), several thin-film devices are provided on a same substrate. For example, thin-film transistors (TFTs) are adopted for a peripheral driving circuit device and/or a pixel switching device, and they are formed on the same substrate.

For the peripheral driving circuit device, the thickness of a gate insulating layer under the gate electrode of the TFT must be reduced so as to enhance driving ability, i.e. to increase the output current at a certain operation voltage.

For the pixel switching device, horizontal switch (HSW) device or electrostatic discharge (ESD) protection device, however, the thickness of the gate insulating layer of the TFT must be increased to ensure reliability of a high-current and high-voltage operation.

In addition, as a necessity of the AMLCD, a capacitor generally comprises a gate insulating layer on, for example, a poly-silicon layer, and a conductive layer (with the same material as the gate electrode) on the gate insulating layer. The sandwiched structure having the gate insulating layer between the poly-silicon layer and the conductive layer forms the capacitor. Due to the rough surface of the poly-silicon layer, reducing the thickness of the gate insulating layer may cause contact between the conductive layer and the ragged poly-silicon layer, thus result in a short circuit.

Accordingly, from the standpoint of circuit design, if the aforementioned thin film device structures are to be formed on the same substrate simultaneously or in parallel, conventional TFT technology cannot provide a manufacturing process suitable for the optimum requirements of all devices, i.e., whenever the thickness of the gate insulating layer is reduced to provide a TFT with better driving ability, the TFT may not fulfill the reliability required by a pixel switching device, and short circuits easily occur in the capacitor.

SUMMARY OF THE INVENTION

The present invention provides a structure for different thin film devices on a substrate, and a method for fabricating the same simultaneously or in parallel on the same substrate, that accommodate the different design requirements for the different devices. In the present disclosure, simultaneous or parallel formation refers to the process of forming thin-film devices involving at least a process step in which a layer is formed which is common to, or extends or forms part of, two or more thin-film devices (e.g., a driving circuit TFT device and a pixel switching TFT device). The common layer to the two or more devices does not have to be a structurally continuous layer.

In one aspect of the present invention, a common thin film layer having the desired thickness (e.g., a characteristic and/or functional thickness, such as a gap thickness) for one type of thin-film device is used as layers that require less critical thickness (or does not form a characteristic and/or functional thickness) in another type of devices. For example, an intermediate layer (or sublayer) of a desired thickness for one type of device is formed simultaneously as an overlayer or underlayer for another type of device. In one embodiment, the intermediate insulating layer of one device (e.g., in a capacitor or as a gate gap layer of a TFT) is simultaneously formed as an overlayer of another device (e.g., a driving circuit TFT).

In another aspect of the present invention, thicknesses of thin films for two different thin-film devices are controlled to be different by providing an additional thin film sublayers for the devices that require a thicker overall layer. The functions of the additional thin film sublayers are different in the two devices. In one embodiment, the intermediate insulating layer between conductive and/or semiconductive layers for one device (e.g., a pixel switching TFT) comprises two or more thinner insulating sublayers, which may be of the same or different thickness, wherein one of the thinner insulating sublayer is also commonly formed simultaneously as an intermediate insulating layer between two conductive and/or semiconductive layers in another device (e.g., a driving circuit TFT and/or thin-film capacitor), and wherein the other one of the commonly formed thinner sublayer functions as an intermediate insulating layer in one device (e.g., pixel switching TFT) but as an overlayer or underlayer in the other device (e.g., driving circuit TFT or capacitor).

In a further aspect of the present invention, two common thin-film layers in one device are adjoining (or separated by another layer in one device), but are separated by another different layer in the other device.

The invention further provides a fabrication method of a thin-film transistor (TFT), which comprises providing a substrate, having a first TFT area and a second TFT area, respectively forming a first active layer and a second active layer on the first TFT area and the second TFT area of the substrate, forming a first gate insulating layer on the first active layer and the second active layer, forming a first gate electrode layer on the first gate insulating layer of the first TFT area, directly forming a second gate insulating layer on the first gate insulating layer of the second TFT area, and forming a second gate electrode layer on the second gate insulating layer of the second TFT area.

The invention further provides a thin-film transistor (TFT), comprising a substrate having a first TFT area and a capacitor area, a first active layer on the first TFT area of the substrate, a first gate insulating layer on the first active layer of the first TFT area and on the capacitor area, a first gate electrode layer simultaneously formed on the first gate insulating layer of the first TFT area and the capacitor area, a second gate insulating layer directly on the first gate electrode layer of the capacitor area, and a second gate electrode layer on the second gate insulating layer of the capacitor area, wherein the first gate electrode layer, second gate insulating layer and second gate electrode layer together form the capacitor.

DESCRIPTION OF THE DRAWINGS

The present invention can be more fully understood by reading the subsequent detailed description and examples with references made to the accompanying drawings, wherein.

DETAILED DESCRIPTION OF THE INVENTION

One embodiment of the present invention provides TFTs with various thicknesses of gate insulating layers and a capacitor comprising a gate insulating layer sandwiched between two conductive layers.

The TFTs and the fabrication method are applicable for a peripheral driving circuit or a pixel switching device.

Figure 1:
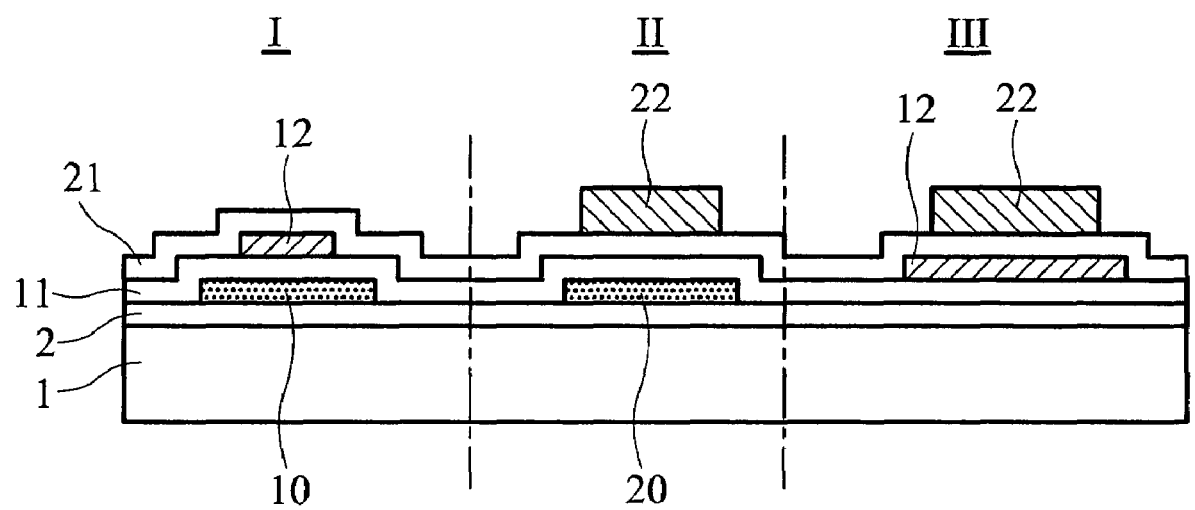
FIG. 1 is a cross-section of a TFT substrate according to one embodiment of the invention.

FIG. 1 is a cross-section of a TFT substrate according to one embodiment of the invention.

A substrate 1 with a buffer layer 2 disposed thereon comprises a first TFT area I and a second TFT area II.

A first active layer 10, a first gate insulating layer 11 and a first gate electrode 12 are sequentially formed on the buffer layer 2 of the first TFT area I.

A second active layer 20, a first gate insulating layer 11, a second gate insulating layer 21 and a second gate electrode 22 are sequentially formed on the buffer layer 2 of the second TFT area II.

A first gate insulating layer 11, a first gate electrode 12, a second gate insulating layer 21 and a second gate electrode 22 are sequentially formed on the capacitor area III.

The first TFT area I is a peripheral driving circuit area, while the second TFT area II is a pixel switching device area.

The substrate 1 is preferably a transparent insulating substrate, for example, a glass substrate. The buffer layer 2 preferably comprises a dielectric material, such as silicon oxide, to further formation of the first active layer 10 and the second active layer 20 on the substrate 1. The first and second active layers 10, 20 are preferably semiconductor layers, for example, amorphous silicon or poly-silicon layers. The first and second gate insulating layers 11, 21 preferably comprise a silicon oxide layer, silicon nitride layer, silicon oxy-nitride layer or a stacked layer of their combinations. The first and second gate insulating layers 11 and 21 may be of the same or different material. The first, second gate electrodes 12, 22 are preferably metal layers, such as molybdenum (Mo), aluminum (Al) or a combination thereof.

The first TFT area I features the first gate insulating layer 11 and the first gate electrode 12 on the first active layer 10, wherein the effective thickness of the gate insulating layer is the thickness of the first gate insulating layer 11.

The second TFT area II features the first gate insulating layer 11, the second gate insulating layer 21 and the second gate electrode 22 on the second active layer 20, wherein the effective thickness of the gate insulating layer is the sum of the thickness of first gate insulating layer 11 and second gate insulating layer 21.

The capacitor area III features the second gate insulating layer 21 and second gate electrode 22 sequentially on the first gate electrode 12, forming the inventive capacitor.

FIGS. 2A–2F illustrate the fabrication of TFTs and capacitor according to the invention.

Figure 2A:
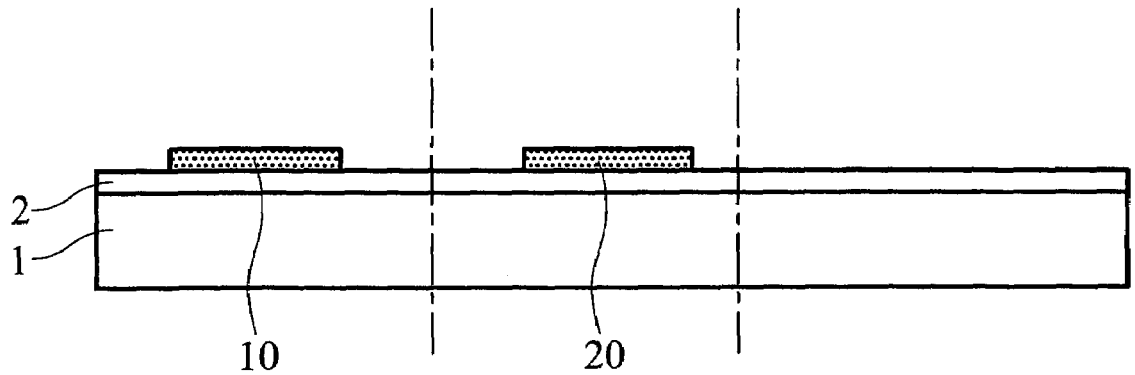
FIGS. 2A–2F illustrate the fabrication of TFTs and capacitor according to one embodiment of the invention.

In FIG. 2A, a substrate 1 is provided with a first TFT area I as a peripheral driving circuit area, a second TFT area II as a pixel switching device area, and a capacitor area III. A buffer layer 2 is then formed on the substrate 1. A first active layer 10 and a second active layer 20 are then respectively formed on the buffer layer 2 of the first TFT area I and the second TFT area II. The thickness and fabrication method of the active layers 10, 20 are not limited. For example, the active layers 10, 20 can be fabricated by a low-temperature-poly-silicon (LTPS) process, by which an amorphous silicon layer is formed on the glass substrate, and then converted into a poly-silicon layer by thermal treatment or excimer laser annealing (ELA).

Figure 2B:
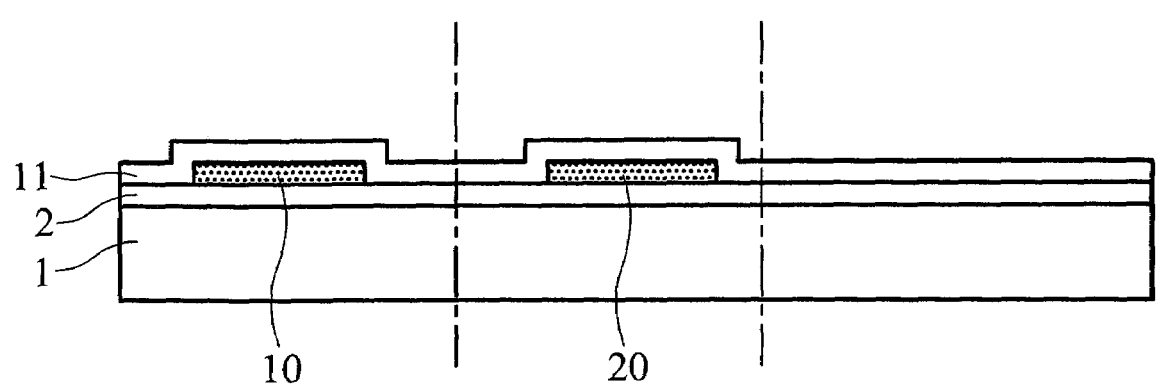
Figure 2C:
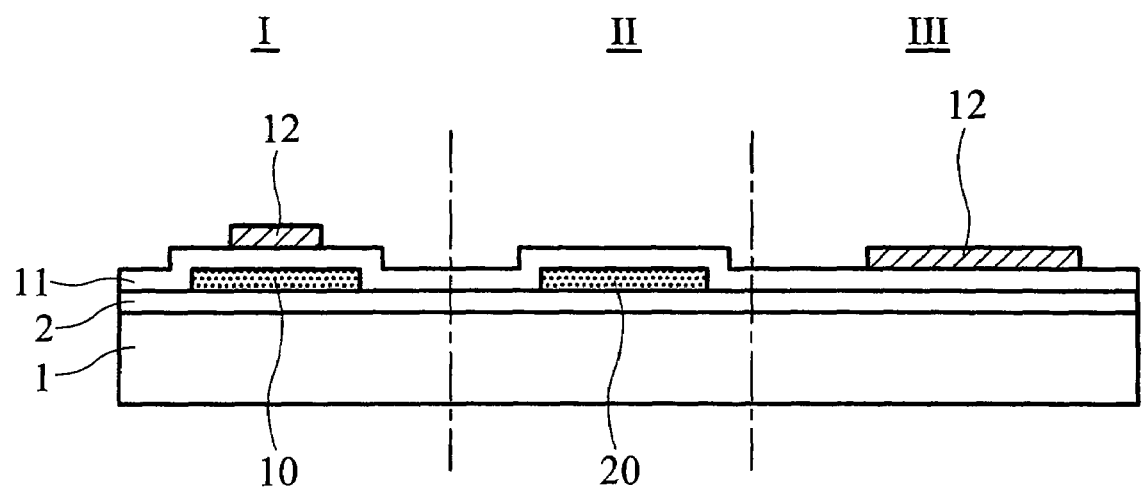

In FIG. 2B, a first insulating layer 11 is then deposited on the first, second active layers 10, 20. The first insulating layer 11 is preferably a silicon oxide layer, silicon nitride layer, silicon oxy-nitride layer or a stack thereof.

Afterwards, a first conductive layer (step not separately shown) is formed on the first insulating layer 11. The first conductive layer is preferably a metal layer, such as molybdenum (Mo), aluminum (Al) or a combination thereof.

A patterned first photoresist is then formed on the first conductive layer, covering predetermined areas of the first TFT area I and capacitor area III. Next, the first conductive layer is etched, using the first photoresist as a mask, to form a first gate electrode 12 on the first TFT area I and capacitor area III. The patterned first photoresist is then removed, as in FIG. 2C.

Figure 2D:
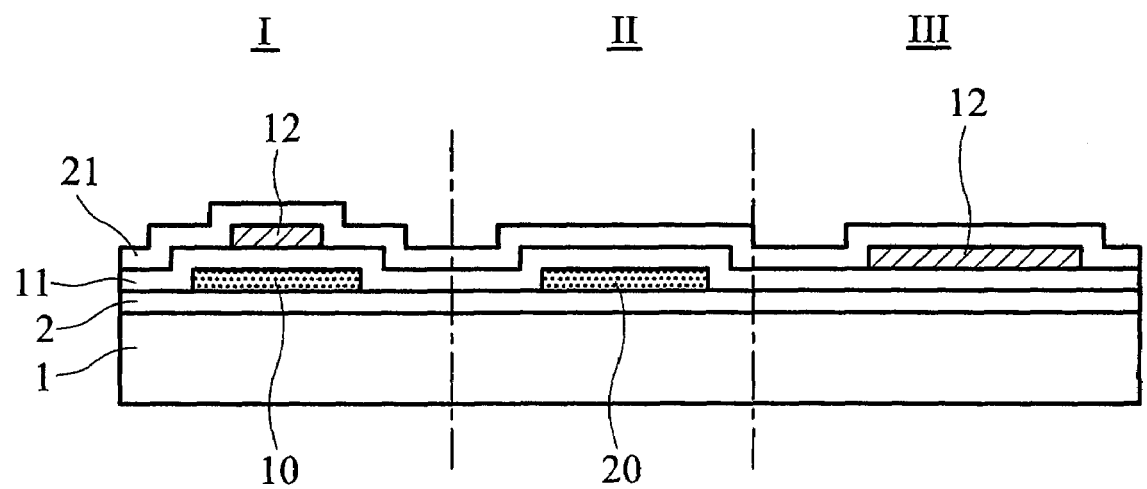
Figure 2E:
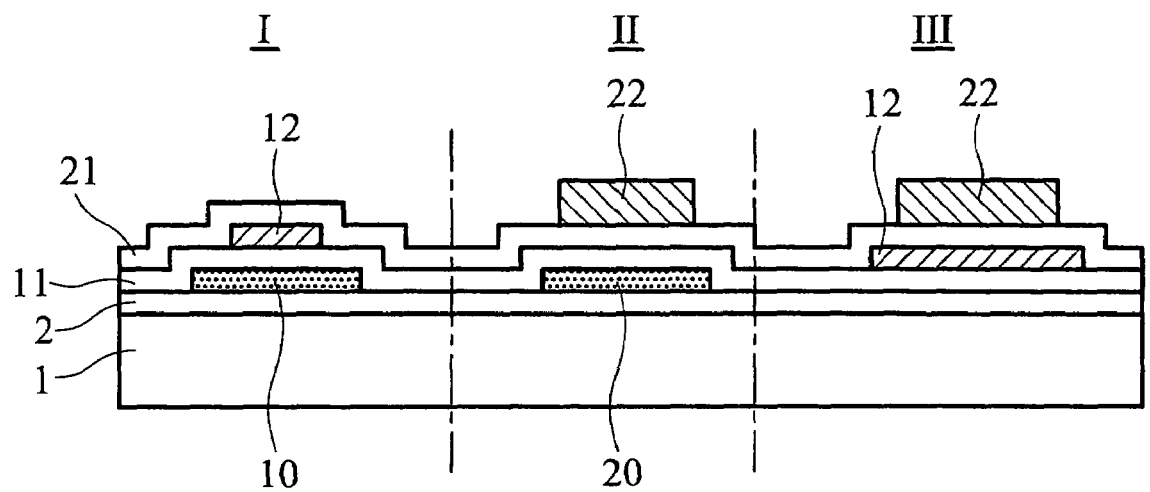

Next, in FIG. 2D, a second insulating layer 21 is deposited on the first TFT area I, second TFT area II and capacitor area III. The second insulating layer 21 is preferably a silicon oxide layer, silicon nitride layer, silicon oxy-nitride layer or a stack thereof.

Afterwards, a second conductive layer (not shown) is formed on the second insulating layer 21. The second conductive layer is preferably a metal layer, such as molybdenum (Mo), aluminum (Al) or a combination thereof.

A patterned second photoresist is then formed on the second conductive layer, covering predetermined areas of the capacitor area III and second TFT area II. Next, the second conductive layer is etched, using the second photoresist as a mask, to form a second gate electrode 22 on the capacitor area III and second TFT area II. The patterned second photoresist is then removed, as in FIG. 2E.

Figure 2F:
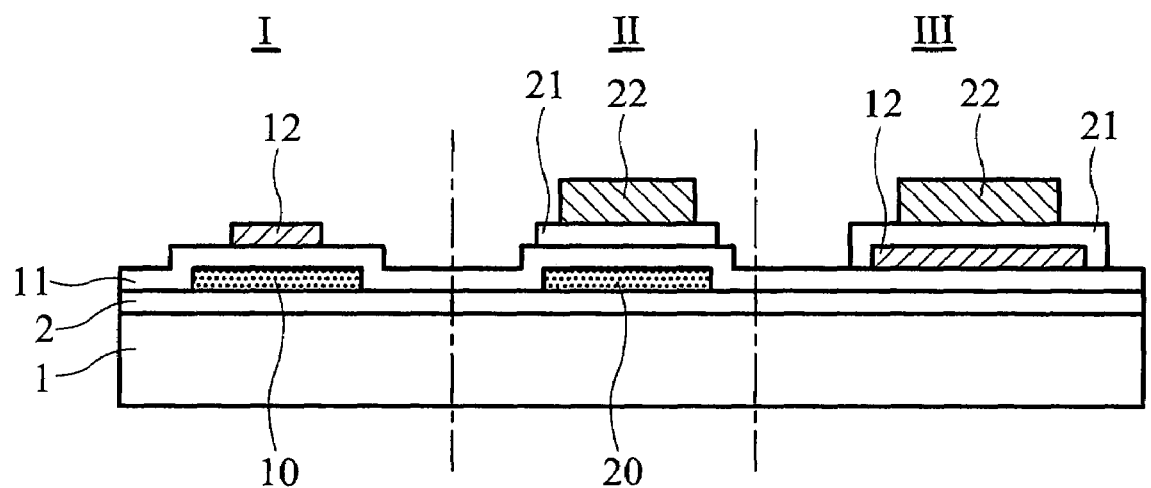

Meanwhile, the etching can be further performed to remove the second insulating layer 21 on the first gate electrode 12, as in FIG. 2F.

In the embodiment, the first gate electrode 12 has a thickness less than that of the second gate electrode 22. The thickness of the first gate electrode 12 is, for example 500 Å~1500 Å, while that of the second gate electrode 22 is, for example 1500 Å~4000 Å. With these preferable thicknesses, the second gate insulating layer 21 on the first gate electrode 12 can be conformally formed, and an adequate thickness of the second gate electrode 22 can be ensured for subsequent interconnect wiring.

The subsequent interconnect wiring comprises formation processes of dielectric layers, contact holes and interconnect wiring, which do not substantially affect the inventive features and effects, and are thereby omitted herefrom.

Accordingly, the inventive TFTs and capacitor have various advantages as following:

First, the individual thicknesses of the first, second gate insulating layers 11, 21 can be adjusted by circuit design requirements, capable of fulfilling the demands of driving ability and reliability.

Next, for TFTs requiring high driving ability, such as the first TFT I for peripheral driving circuit in the embodiment, etching may be easily controlled by reducing the thickness of the first gate electrode 12, with critical dimension (CD) loss reduced thereby. Meanwhile, the driving voltage is reduced, and the response speed is enhanced.

In addition, for TFTs requiring reliability, such as the second TFT II for pixel switching device in the embodiment, the effective thickness of the gate insulating layer is increased by stacking the second gate insulating layer 21 on the first insulating layer 11, increasing reliability of the TFT, and furthering high-voltage and high-current operation.

Furthermore, for capacitors, such as the capacitor III of the embodiment, by stacking the first gate electrode 12, the second gate electrode 22 and the second gate insulating layer 21, the conventional poly-silicon/gate insulating layer/gate electrode structure is replaced, a novel capacitor structure is provided without the rough surface of the poly-silicon layer, and better performance is achieved.

It is appreciated that the various layers described above may comprises two or more sublayers making up the corresponding layer, of the same material and thickness, or of different material and thicknesses. For example, while the above described embodiments illustrate only one insulating layer 12 between the conducting layers 12 and 22 in capacitor area III, the layer 12 may comprise several sublayers.

Figure 3:
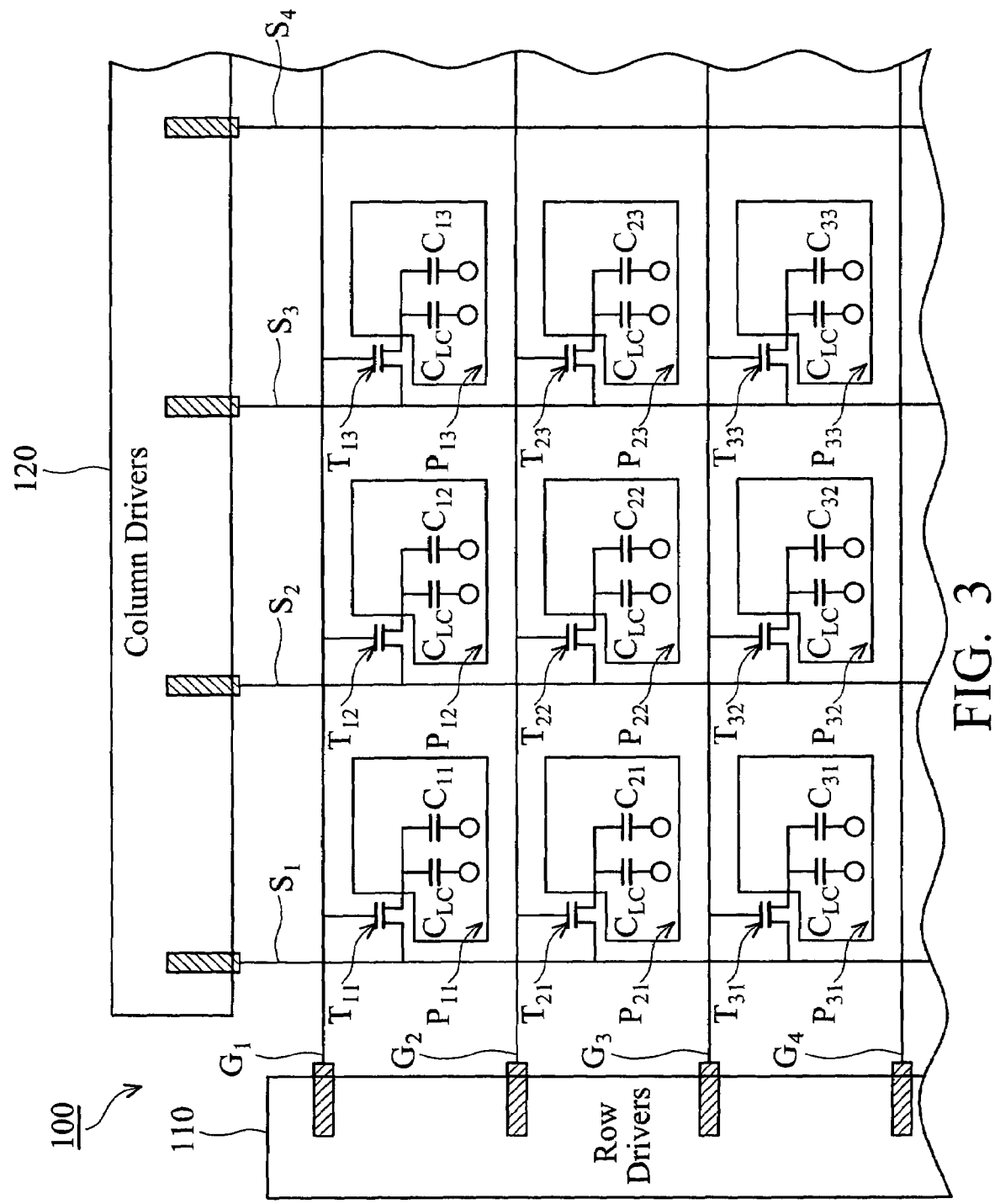
FIG. 3 is a planar circuit diagram illustrating the interrelationship of various thin-film devices, such as capacitor, driver, and pixel switch, and relationship to display element according to one embodiment of the present invention.

FIG. 3 is a planar circuit diagram illustrating the interrelationship of various thin-film devices, such as capacitor, driver, and pixel switch, and relationship to display element according to the present invention. Referring to FIG. 3, a TFT switching element ($T_{11}$, for example) is provided to control each pixel ($C_{LC}$ of pixel $P_{11}$, for example). The TFT switching element $T_{11}$ has its gate connected to scanning line $G_1$, and has its source connected to a signal line $S_1$, and has its drain connected to one terminal of a pixel $C_{LC}$ and capacitance $C_{11}$. The other terminal of the pixel $C_{LC}$ and capacitance $C_{11}$ is connected to ground. Column drivers 120 can comprise peripheral driving circuit devices (not shown) such as shift registers and level shifters.

Referring again to the pixel $P_{11}$, when a voltage (e.g. 12V) is supplied to the scanning line $G_1$, the TFT switching element $T_{11}$ turns on, so that a signal voltage (for $C_{LC}$ of $P_{11}$) can be written to the signal line $S_1$. Row drivers 110 can also comprise peripheral driving circuit devices (not shown) such as shift registers and level shifters.

Figure 4:
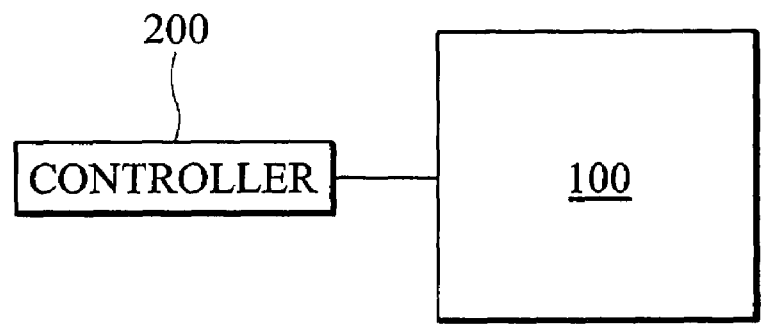
FIG. 4 is a schematic diagram of a display incorporating the inventive thin-film devices in accordance with one embodiment of the present invention.

FIG. 4 is a schematic diagram of a display 300 incorporating the inventive thin-film devices in accordance with one embodiment of the present invention. The display panel 100 can be coupled to a controller 200, forming a display device 300 as shown in FIG. 3. The controller 200 can comprise a time control circuit, charge pump circuit, digital-analog converter and etc (not shown) to control the display panel 100 to render image in accordance with an input.

Figure 5:
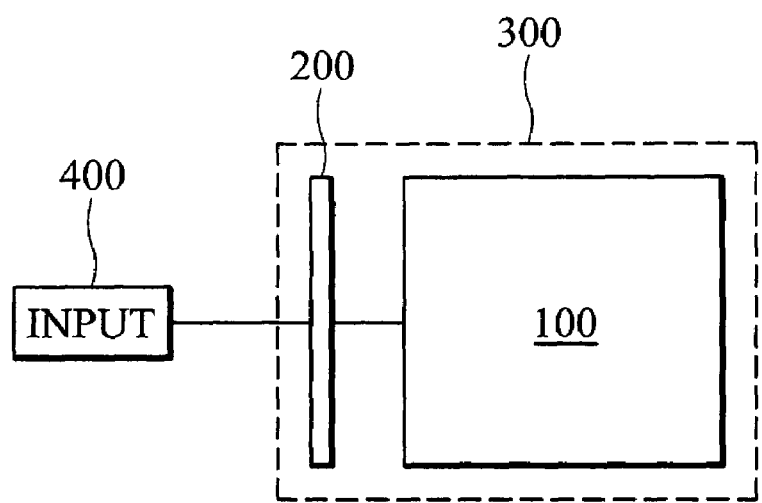
FIG. 5 is a schematic diagram of an electronic device, incorporating a display having the inventive thin-film devices in accordance with one embodiment of the present invention.

FIG. 5 is a schematic diagram of an electronic device 500, incorporating a display 300 having the inventive thin-film devices in accordance with one embodiment of the present invention. An input device 400 is coupled to the controller 200 of the display device 300 shown in FIG. 4 can include a processor or the like to input data to the controller 200 to render an image. The electronic device 500 may be a portable device such as cell phone, notebook computer, PDA, and etc.

The foregoing description has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A thin-film structure, comprising:
   a substrate defined with a first device area for the first device and a second device area for the second device; and
   a plurality of thin film layers in the first and second device areas, at least one of the plurality of layers is a common layer to the first and second devices;
   wherein said common layer defines a characteristic functional thickness in at least one of the first and second devices, but not both;
   wherein the common layer comprises a first thin-film layer in the first device and a second thin-film layer in the second device, the thickness of the first thin-film layer alone defines a characteristic functional gap between thin-film layers immediately adjacent to the first thin-film layer, and the thickness of the second thin-film layer alone does not define a characteristic functional gap between thin-film layers immediately adjacent to the second thin-film layer;
   wherein the first device corresponds to at least one of a first TFT and capacitor, wherein the first thin-film layer define a gate gap thickness of the first TFT or a gap thickness of the capacitor, and the second device corresponds to a second TFT, wherein the second TFT includes a third thin-film layer in addition to the second thin-film layer to define a gate gap thickness of the second TFT, wherein the third thin-film does not contribute to the gate gap thickness of the first TFT, and wherein the third thin-film layer is common to the first device.

2. The thin-film structure as in claim 1, wherein the first thin-film layer serves a first function in the first device, and the second thin-film layer serves a second function in the second device, and wherein the thickness of the second thin-film layer has less impact to the second function than the thickness of the first thin-film layer has to the first function.

3. The thin-film structure as in claim 1, wherein the third thin-film layer is below or above the first thin-film layer and its immediately adjacent layers.

4. The thin-film structure as in claim 1, wherein the first film device is a first TFT having a first gate gap thickness, and the second device is a second TFT having a second and different gate gap thickness, wherein the common layer alone defines one of the first and second gate gap thickness but not both.

5. The thin-film structure as in claim 1, wherein the first device is a TFT having a gate gap thickness, and the second device is a capacitor having a capacitive gap thickness, wherein the common layer alone defines one of the gate gap thickness end capacitive gap thickness but not both.

6. A display device comprising:
a display element; and
a display controller operatively coupled to the display element, said display controller comprising components having a thin-film structure as in claim 1.

7. An electronic device, comprising:
a display device as in claim 6; and
a controller controlling the function of the display device to render an image.

8. A thin-film structure, comprising:
a substrate defined with a first device area for the first device and a second device area for the second device; and
a first plurality of thin-film layers in the first device area end a second plurality of thin-film layers in the second device area, at least one of the first plurality of layers and at least one of the second plurality of thin-film layers are part of a common layer to the first and second devices,
wherein the first plurality of thin-film layers comprises at least two layers, one of which is a first thin film layer of the common layer, and the second plurality of thin-film layers comprises same at least two layers, one of which is a second thin-film layer of the common layer, and wherein the at least two layers in the first device are separated by a first intermediate layer and the same at least two layers in the second device are adjoining or separated by a second and different intermediate layer.

9. The thin-film structure as in claim 8, wherein the first device corresponds to at least one of (a) a first TFT having a gate gap thickness substantially defined by the first thin film layer, and (b) a capacitor which includes two conductive layers spaced apart by a gap substantially defined by the first thin-film layer in the capacitor, and wherein the second device corresponds to a second TFT.

10. The thin-film structure as in claim 9, wherein the second TFT has a gate gap thickness that is thicker than that of the first TFT.

11. The thin-film structure as in claim 8, wherein the first device corresponds to at least one of a first TFT end a capacitor, and the second device corresponds to a second TFT, and wherein the first intermediate layer comprises a conductive or an active semiconductive layer.

12. The thin-film structure as in claim 11 wherein the at least two layers are insulating layers.

13. The thin-film structure as in claim 8, wherein the second device corresponds to at least one of a first TFT and a second TFT having different gate layer thickness, and the first device corresponds to a capacitor, and wherein the first intermediate layer comprises an active semiconductor layer.

14. The thin-film structure as in claim 13, wherein the at least two layers includes an insulating layer and a buffer layer.

15. A thin-film structure, comprising:
a substrate defined with a first device area and a second device area;
a first plurality of thin-film layers supported by the substrate in the first device area corresponding to a first device; and
a second plurality of thin-film layers supported by the substrate in the second device area corresponding to a second device;
wherein at least a first thin film layer in the first device is a common layer having the same thickness and material as at least a second thin film layer in the second device, and wherein the first thin film layer is structured in relation to its immediately adjacent thin film layers to define a characteristic functional thickness in the first device but not in the second device,
wherein the first plurality of thin film layers comprises at least two layers and the second plurality of thin film layers comprises same at least two layers, and wherein the at least two layers in the first device are separated by a first intermediate layer and the same at least two layers in the second device are adjoining.

* * * * *